United States Patent
Chang et al.

(10) Patent No.: US 11,107,696 B1
(45) Date of Patent: Aug. 31, 2021

(54) IMPLANTATION FOR ETCH STOP LINER

(71) Applicant: XILINX, INC., San Jose, CA (US)

(72) Inventors: Li-Wen Chang, Campbell, CA (US); Ping-Chin Yeh, San Jose, CA (US)

(73) Assignee: XILINX, INC., San Jose, CA (US)

(*) Notice: Subject to any disclaimer, the term of this patent is extended or adjusted under 35 U.S.C. 154(b) by 37 days.

(21) Appl. No.: 16/667,176

(22) Filed: Oct. 29, 2019

(51) Int. Cl.
*H01L 21/336* (2006.01)
*H01L 21/02* (2006.01)
*H01L 21/3115* (2006.01)
*H01L 21/265* (2006.01)
*H01L 21/311* (2006.01)
*H01L 21/768* (2006.01)

(52) U.S. Cl.
CPC .. *H01L 21/31155* (2013.01); *H01L 21/26586* (2013.01); *H01L 21/311* (2013.01); *H01L 21/76829* (2013.01)

(58) Field of Classification Search
CPC ............... H01L 21/76829; H01L 29/7848
USPC ......... 438/180–182, 299–301; 257/338, 346, 257/387–389
See application file for complete search history.

(56) References Cited

U.S. PATENT DOCUMENTS

| | | | |
|---|---|---|---|
| 8,394,712 B2* | 3/2013 | Dube | H01L 21/823878 438/607 |
| 8,664,056 B2* | 3/2014 | Wirbeleit | H01L 21/26506 438/198 |
| 8,906,811 B2* | 12/2014 | Kammler | H01L 29/7848 438/733 |
| 9,343,300 B1* | 5/2016 | Jacob | H01L 29/66636 |
| 9,543,387 B2* | 1/2017 | Chang | H01L 29/0843 |
| 10,079,305 B2 | 9/2018 | Lee et al. | |
| 2019/0181243 A1 | 6/2019 | Vinslava et al. | |

* cited by examiner

*Primary Examiner* — Calvin Lee
(74) *Attorney, Agent, or Firm* — Patterson + Sheridan, LLP

(57) ABSTRACT

Examples described herein provide for methods for semiconductor processing for forming source/drain regions of transistors. An example is a method for semiconductor processing. An etch stop liner is formed in a semiconductor substrate. Forming the etch stop liner includes implanting etch selectivity dopants into the semiconductor substrate. The etch selectivity dopants form at least part of the etch stop liner. A source/drain cavity is formed in the semiconductor substrate. Forming the source/drain cavity includes etching the etch stop liner. Etching the etch stop liner selectively etches the etch stop liner relative to a material of the semiconductor substrate. A source/drain region is epitaxially grown in the source/drain cavity.

17 Claims, 6 Drawing Sheets

IMPLANTATION FOR ETCH STOP LINER

TECHNICAL FIELD

Examples of the present disclosure generally relate to methods for semiconductor processing and, in particular, to methods for semiconductor processing for forming source/drain regions of transistors.

BACKGROUND

Integrated circuits generally implement a large number of transistors, among other possible devices (e.g., passive devices). As technology advances, sizes of dimensions of transistors has decreased. Reduction in some sizes has resulted in improved performance, such as lower threshold voltage for improved speed. Other advances have been made to further improve performance, such as strained channels of transistors. Carrier mobility can be increased by appropriately strained channels, which can improve current through the channel. In many instances, an improvement in one aspect of a transistor can be detrimental in another aspect. Semiconductor processing seeks to balance countervailing considerations to create transistors with a desired performance.

SUMMARY

Examples described herein provide for methods for semiconductor processing for forming source/drain regions of transistors. More specifically, some examples described herein provide for methods for controlling respective profiles of source/drain regions.

An example of the present disclosure is a method for semiconductor processing. An etch stop liner is formed in a semiconductor substrate. Forming the etch stop liner includes implanting etch selectivity dopants into the semiconductor substrate. The etch selectivity dopants form at least part of the etch stop liner. A source/drain cavity is formed in the semiconductor substrate. Forming the source/drain cavity includes etching the etch stop liner. Etching the etch stop liner selectively etches the etch stop liner relative to a material of the semiconductor substrate. A source/drain region is epitaxially grown in the source/drain cavity.

Another example of the present disclosure is a method for semiconductor processing. A gate structure is formed on a semiconductor substrate. Etch selectivity dopants are implanted into the semiconductor substrate on opposing sides of the gate structure. The etch selectivity dopants form at least part of respective etch stop liners in the semiconductor substrate on the opposing sides of the gate structure. The etch stop liners are etched to define surfaces of cavities in the semiconductor substrate on the opposing sides of the gate structure. An epitaxial source/drain region is epitaxially grown in each of the cavities.

A further example of the present disclosure is a method for semiconductor processing. A gate structure is formed on a semiconductor substrate. A gate spacer is formed along a sidewall of the gate structure and on the semiconductor substrate. Oxygen is implanted into the semiconductor substrate. The implanted oxygen extends to be at least partially directly under the gate spacer. The oxygen is reacted with a material of the semiconductor substrate to form an etch stop liner. Reacting the oxygen with the material of the semiconductor substrate includes performing an anneal. The material of the semiconductor substrate above the etch stop liner is etched. Etching the material of the semiconductor substrate selectively etches the material of the semiconductor substrate relative to the etch stop liner. After etching the material of the semiconductor substrate, the etch stop liner is removed. Removing the etch stop liner includes etching the etch stop liner. Etching the etch stop liner selectively etches the etch stop liner relative to the material of the semiconductor substrate. An epitaxial material is epitaxially grown where the etch stop liner was removed.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
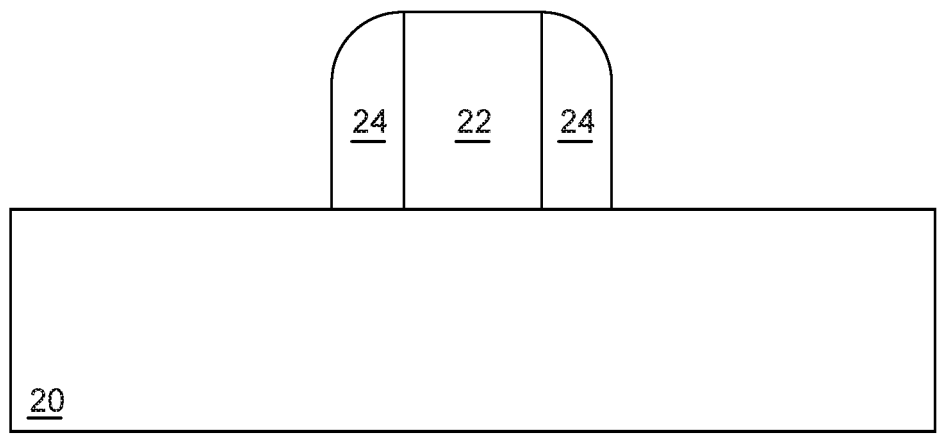
FIGS. 1 through 7 are cross-sectional views of respective structures at various stages of semiconductor processing to form a transistor according to some examples.

Examples described herein provide for methods for semiconductor processing for forming source/drain regions of transistors. More specifically, some examples described herein provide for methods for controlling respective profiles of source/drain regions. Etch selectivity dopants, such as oxygen, nitrogen, or the like, can be implanted into a semiconductor substrate where source/drain regions are to be formed. The implanted etch selectivity dopants can react with a material of the semiconductor substrate to form an etch stop liner. The etch stop liner can provide etch selectivity that permits controlling the profile of a cavity that is etched and in which an epitaxial source/drain region is formed.

In semiconductor processing, etches used to form cavities in a semiconductor substrate for epitaxial source/drain regions can be selective to certain crystalline planes. Such etches may be beneficial to form the cavity defined by crystalline plane surfaces in the semiconductor substrate and extending below a gate spacer and closer to a channel region such that the epitaxial source/drain region formed in the cavity can better exert stress on the channel region to strain the channel region. Such etches are generally time-controlled and are therefore subject to possible significant variation. Additionally, such etches can be influenced by a loading effect that results from the density of patterns or components (e.g., gates and gate spacers) on the semiconductor substrate. Accordingly, such etches can over-etch and can cause the transistor to be susceptible to short channel effects.

Some examples described herein provide for profile control of a source/drain region by forming an etch stop liner in the semiconductor substrate through implanting etch selectivity dopants. The implantation can be better controlled, which can result in formation of transistors with reduced susceptibility to short channel effects. Etch selectivity provided by the etch stop liner can obviate use of time-controlled etches.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIGS. 1 through 7 illustrate cross-sectional views of structures at various stages of semiconductor processing to form a transistor according to some examples. Examples contemplate the transistor being a planar transistor (e.g., a planar field effect transistor (FET)) or a fin transistor (e.g., a finFET). The transistor can be a p-type transistor or an n-type transistor. Various materials and components described herein are described broadly and generically, and a person having ordinary skill in the art will readily understand, e.g., materials and processes applicable for different types of transistors. Additionally, the processing of FIGS. 1 through 7 is described in the context of a replacement gate process, and other examples contemplate a gate first process. The cross-sectional views of FIGS. 1 through 7 are along a cross-section between source/drain regions and across a channel region of the transistor (e.g., in a longitudinal direction of a fin if the transistor is a finFET).

FIG. 1 illustrates a dummy gate 22 formed on an active area of a semiconductor substrate 20. The semiconductor substrate 20 can be any appropriate semiconductor substrate, such as a bulk semiconductor wafer, a semiconductor-on-insulator (SOI) wafer, or the like. The semiconductor material of the semiconductor substrate 20 can be any appropriate material, such as silicon. In some examples, the semiconductor substrate 20 is a bulk silicon wafer. The active area can be, for example, a fin (e.g., for a finFET) defined in the semiconductor substrate 20, such as by recessing trenches in the semiconductor substrate 20 to form a fin between neighboring recesses. The active area can be an area defined by isolation regions, such as shallow trench isolations (STIs). The dummy gate 22 can include an interfacial layer on the active area of the semiconductor substrate 20 and a sacrificial material on the interfacial layer. The interfacial layer can be a material different from the sacrificial material and may act as an etch stop layer for removal of the sacrificial material. The interfacial layer can be formed by depositing the layer, such as by chemical vapor deposition (CVD) or the like, or by oxidizing an exterior portion of the semiconductor substrate 20, such as by steam or chemical oxidation. The sacrificial material can be deposited on the interfacial layer, such as by physical vapor deposition (PVD), CVD, or the like. In some examples, the interfacial layer is silicon oxide and the sacrificial material is polysilicon or amorphous silicon. Gate spacers 24 are along respective sidewalls of the dummy gate 22 and on the active area of the semiconductor substrate 20. The gate spacers 24 can be formed by conformally depositing (such as by plasma enhanced CVD (PECVD), atomic layer deposition (ALD), or the like) one or more layers of silicon nitride, silicon oxynitride, silicon carbon nitride, silicon oxycarbide, or the like, and anisoptropically etching (such as by a reactive ion etch (RIE)) the one or more layers.

Figure 2:
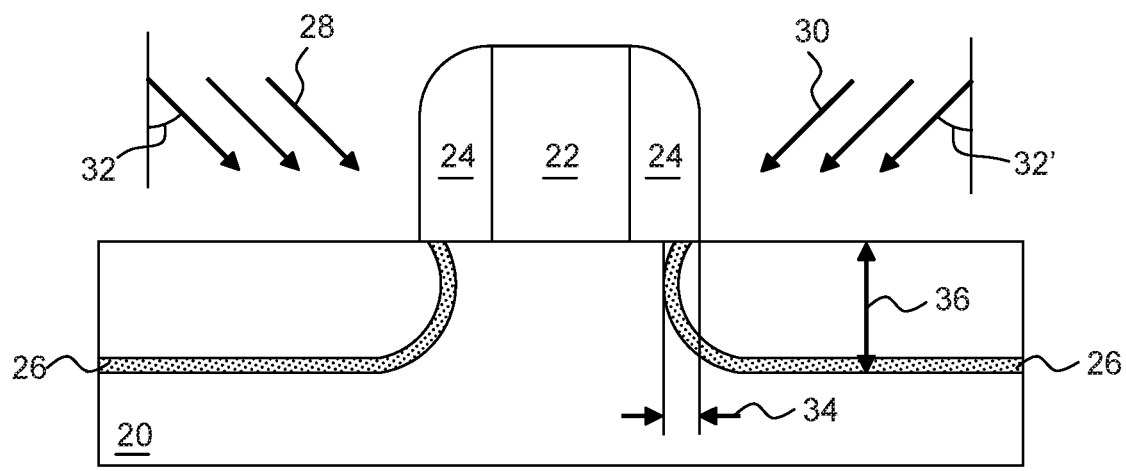

FIG. 2 illustrates implanting etch selectivity dopants 26 into the active area of the semiconductor substrate 20. The etch selectivity dopants 26 are implanted using complementary tilt implants 28, 30. In a first tilt implant 28, the etch selectivity dopants 26 are implanted at a tilt angle 32 measured in a first direction from an axis extending perpendicularly from a top surface of the semiconductor substrate 20. In a second tilt implant 30, the etch selectivity dopants 26 are implanted at a tilt angle 32' measured in a second direction opposite from the first direction and from the axis extending perpendicularly from the top surface of the semiconductor substrate 20. Magnitudes of the tilt angles 32, 32' are equal in some examples. As an example, the first tilt implant 28 can be performed with the semiconductor substrate 20 tilted with respect to the implant direction to achieve the tilt angle 32. After the first tilt implant 28, the semiconductor substrate 20 is rotated 180°, and the second tilt implant 30 can be performed to achieve the tilt angle 32'. The etch selectivity dopants 26 can be implanted in a profile that extends under the gate spacers 24 a lateral distance 34 and to a depth 36 from the top surface of the semiconductor substrate 20. In some examples at a 16 nm technology node, the lateral distance 34 can be in a range from 3 nm to 5 nm, and the depth 36 can be in a range from 46 nm to 50 nm. The lateral distance 34 and depth 36 can be different from these examples, such as for different technology nodes. As will become apparent, the profile of the etch selectivity dopants 26 can define a profile of a source/drain region that is to be formed.

In some examples, the tilt implants 28, 30 can implant, as the etch selectivity dopants 26, oxygen, nitrogen, or another dopant capable of forming a material that can be selectively etched. The tilt implants 28, 30 can be performed at an energy in a range from 150 keV to 200 keV. The dosage of the tilt implants 28, 30 can be in a range from $7 \times 10^{17}$ $cm^{-2}$ to $2 \times 10^{18}$ $cm^{-2}$. A magnitude of the tilt angles 32, 32' can be in a range from 20° to 50°. The etch selectivity dopants 26 can be implanted by the tilt implants 28, 30 to a concentration in a range from $3 \times 10^{22}$ $cm^{-3}$ to $4 \times 10^{22}$ $cm^{-3}$.

Figure 3:
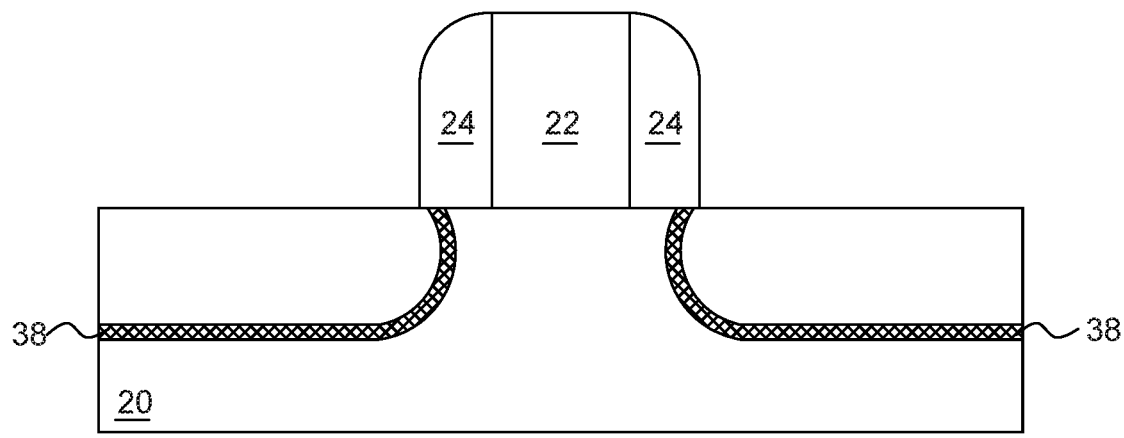

FIG. 3 illustrates etch stop liners 38 formed from the etch selectivity dopants 26. An anneal can be performed to react the etch selectivity dopants 26 with the semiconductor material of the semiconductor substrate 20 to form the etch stop liners 38. The anneal can be a laser anneal (e.g., a nanosecond laser anneal) or another anneal process. In some examples, the etch selectivity dopants 26 are oxygen, and the semiconductor material of the semiconductor substrate 20 is silicon. In such examples, the anneal causes the oxygen and silicon to react to form silicon oxide as the etch stop liners 38. The etch stop liners 38 can be formed generally where the etch selectivity dopants 26 were implanted. Hence, at least a portion of the etch stop liner 38 can extend under a corresponding gate spacer 24.

Figure 4:
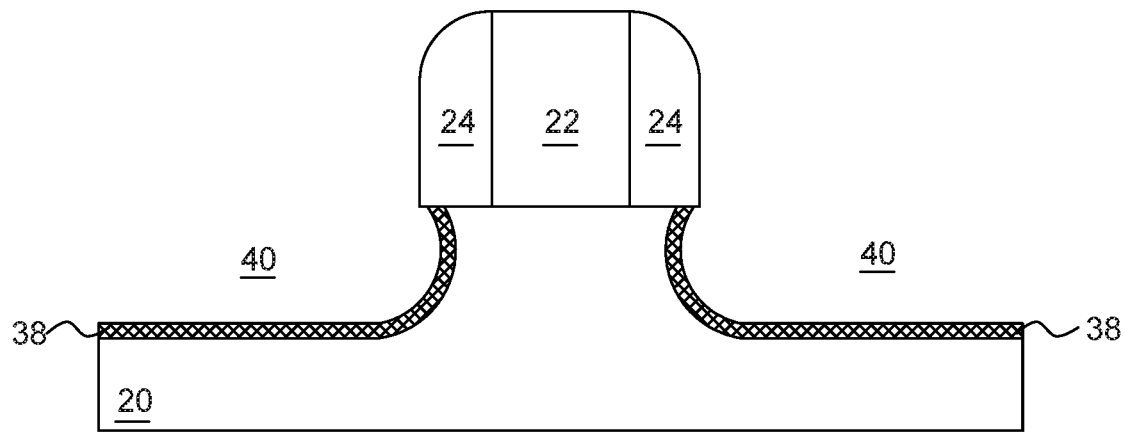

FIG. 4 illustrates forming partial source/drain cavities 40 in the active area of the semiconductor substrate 20. The partial source/drain cavities 40 can be formed by etching exposed areas of the active area of the semiconductor substrate 20. The etch process can be an isotropic etch. The etch process selectively etches the material of the semiconductor substrate 20 relative to the etch stop liner 38 such that the etch process does not significantly etch the etch stop liners 38. The etch process etches and removes material of the semiconductor substrate 20 that is above the etch stop liners 38. The etch stop liner 38 is capable of preventing further significant etching of the semiconductor substrate 20 when the etch process that forms the partial source/drain cavities 40 reaches the etch stop liner 38. In some examples, the etch process is an isotropic wet etch, and when the material of the semiconductor substrate 20 is silicon, can include using tetramethylammonium hydroxide (TMAH), nitric acid ($HNO_3$), or the like.

Figure 5:
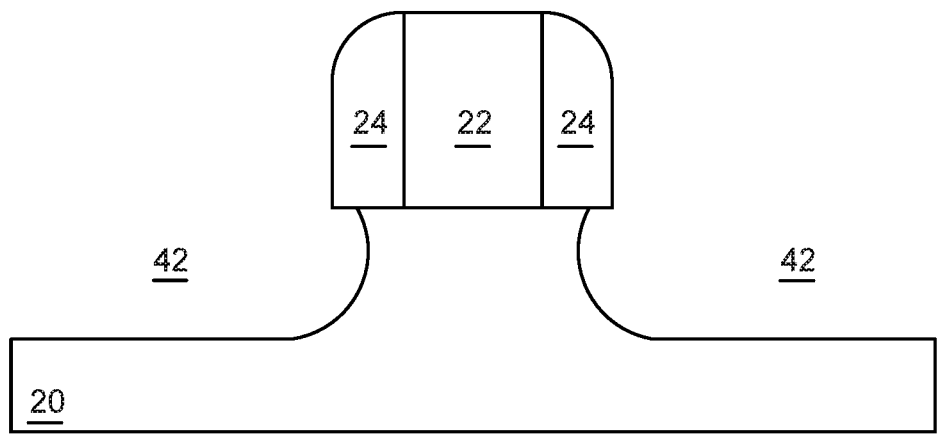

FIG. 5 illustrates forming source/drain cavities 42 in the active area of the semiconductor substrate 20 by removing the etch stop liner 38. The etch stop liner 38 can be removed by etching the etch stop liner 38. The etch process can be an isotropic etch. The etch process selectively etches the material of the etch stop liners 38 relative to the material of the semiconductor substrate 20 such that the etch process does not significantly etch the semiconductor substrate 20. The etch process etches and removes material of the etch stop liners 38. The material of the semiconductor substrate 20 is prevented from being significantly etched due to the selectivity of the etch process. In some examples, the etch process is an isotropic wet etch, and when the material of the etch stop liners 38 is silicon oxide, can include using hydroflouric acid (HF) or the like.

The source/drain cavities 42 can therefore be defined by the etch stop liners 38, which were defined by the tilt implants 28, 30. Surfaces that define the source/drain cavities 42 can be defined by where the etch stop liners 38 are removed. The surfaces of the source/drain cavities 42 can be any surfaces, and one or more of the surfaces of the source/drain cavities 42 can be non-crystalline planes (e.g., not planes defined by the Miller indices). As illustrated, respective surfaces of the source/drain cavities 42 proximate and/or directly underlying the gate spacers 24 can be non-crystalline plane surfaces, such as curved (e.g., concave) surfaces.

Due to the selectivity of the etch processes that form the source/drain cavities 42, the etch processes can be performed without timing the etch processes. The etch processes can naturally substantially stop etching when the etch process reaches a material, such as the etch stop liner 38, that the etch process does not selectively etch.

Figure 6:
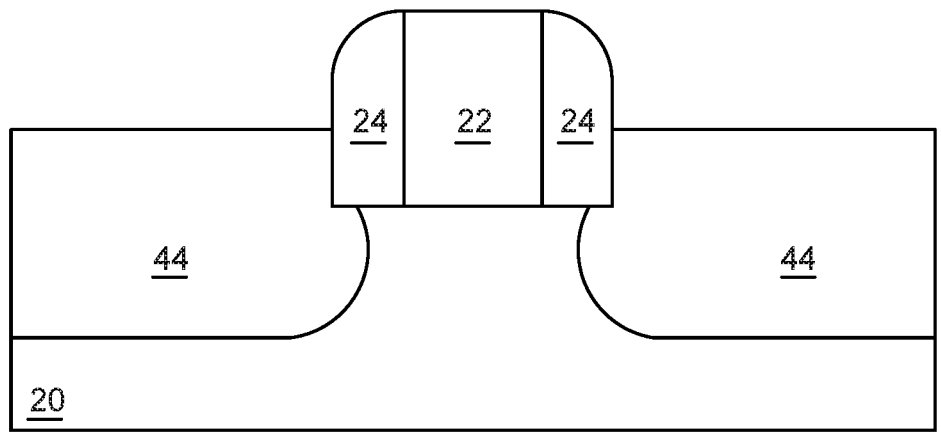

FIG. 6 illustrates forming epitaxial source/drain regions 44 in the source/drain cavities 42. The epitaxial source/drain regions 44 can be formed using epitaxial growth processes, such as metal organic CVD (MOCVD), low pressure CVD (LPCVD), liquid phase epitaxy (LPE), selective epitaxial growth, or the like. The epitaxial source/drain regions 44 can be silicon germanium (SiGe) or another material appropriate for a p-type transistor, or can be silicon phosphide (SiP) or another material appropriate for an n-type transistor. The epitaxial source/drain regions 44 can have top surfaces that are above the top surface of the active area of the semiconductor substrate 20 and may be raised epitaxial source/drain regions.

In some examples, such as illustrated, the source/drain cavities 42 can extend at least partially directly under respective gate spacers 24. Curved, non-crystalline plane surfaces of the source/drain cavities 42 can be at least partially directly under respective gate spacers 24. Hence, the epitaxial source/drain regions 44 can be epitaxially grown from these curved, non-crystalline plane surfaces. The epitaxial source/drain regions 44 can at least partially underlie the gate spacers 24 and be near the channel region in the semiconductor substrate 20 underlying the dummy gate 22. The epitaxial source/drain regions 44 can therefore efficiently exert stress to the channel region and cause the channel region to be strained.

Figure 7:
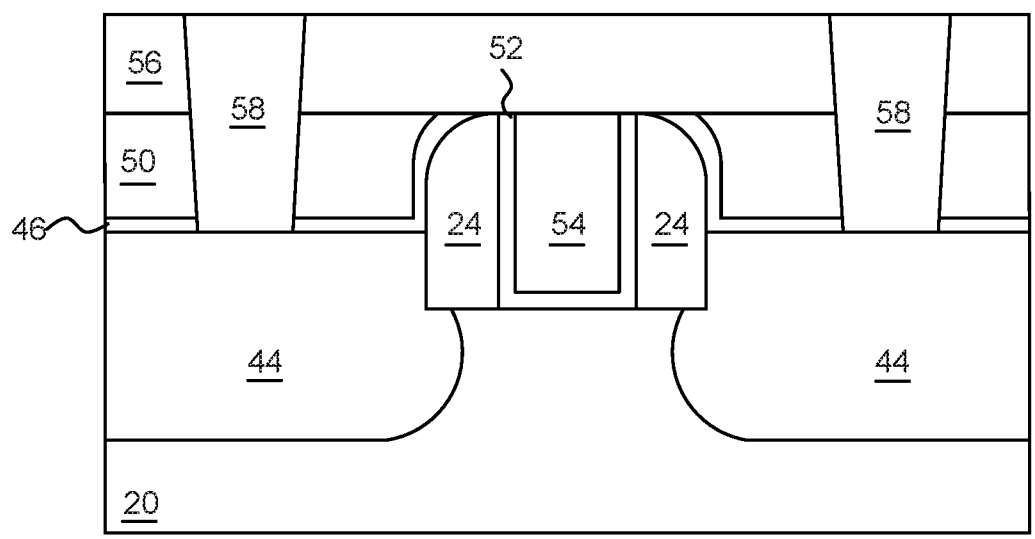

FIG. 7 illustrates a structure of the transistor after subsequent processing. Generally, an etch stop layer 46 is conformally deposited over the dummy gate 22, gate spacers 24, and epitaxial source/drain regions 44. A first inter-layer dielectric (ILD) 50 is deposited over the etch stop layer 46. The first ILD 50 and the etch stop layer 46 are partially removed and planarized (e.g., by chemical mechanical polishing (CMP)) to expose the dummy gate 22. The dummy gate 22 is then removed by an etch process. A gate dielectric 52 is conformally deposited where the dummy gate 22 was removed, and a functional gate 54 is deposited on the gate dielectric 52. The functional gate 54 can include one or more work-function tuning layers, for example. Any excess gate dielectric 52 and functional gate 54 above the first ILD 50 can be removed by a planarization process. A second ILD 56 is deposited on the first ILD 50 and functional gate 54 as illustrated. Contact opening are then etched through the second ILD 56, first ILD 50, and etch stop layer 46 to respective epitaxial source/drain regions 44. Contacts 58 are then formed in the contact openings. Each contact 58 can include silicide on the epitaxial source/drain regions 44, an adhesion layer, and/or a barrier layer. A person having ordinary skill in the art will readily understand appropriate processes and materials that may be performed or used in forming the structure of FIG. 7.

Figure 8:
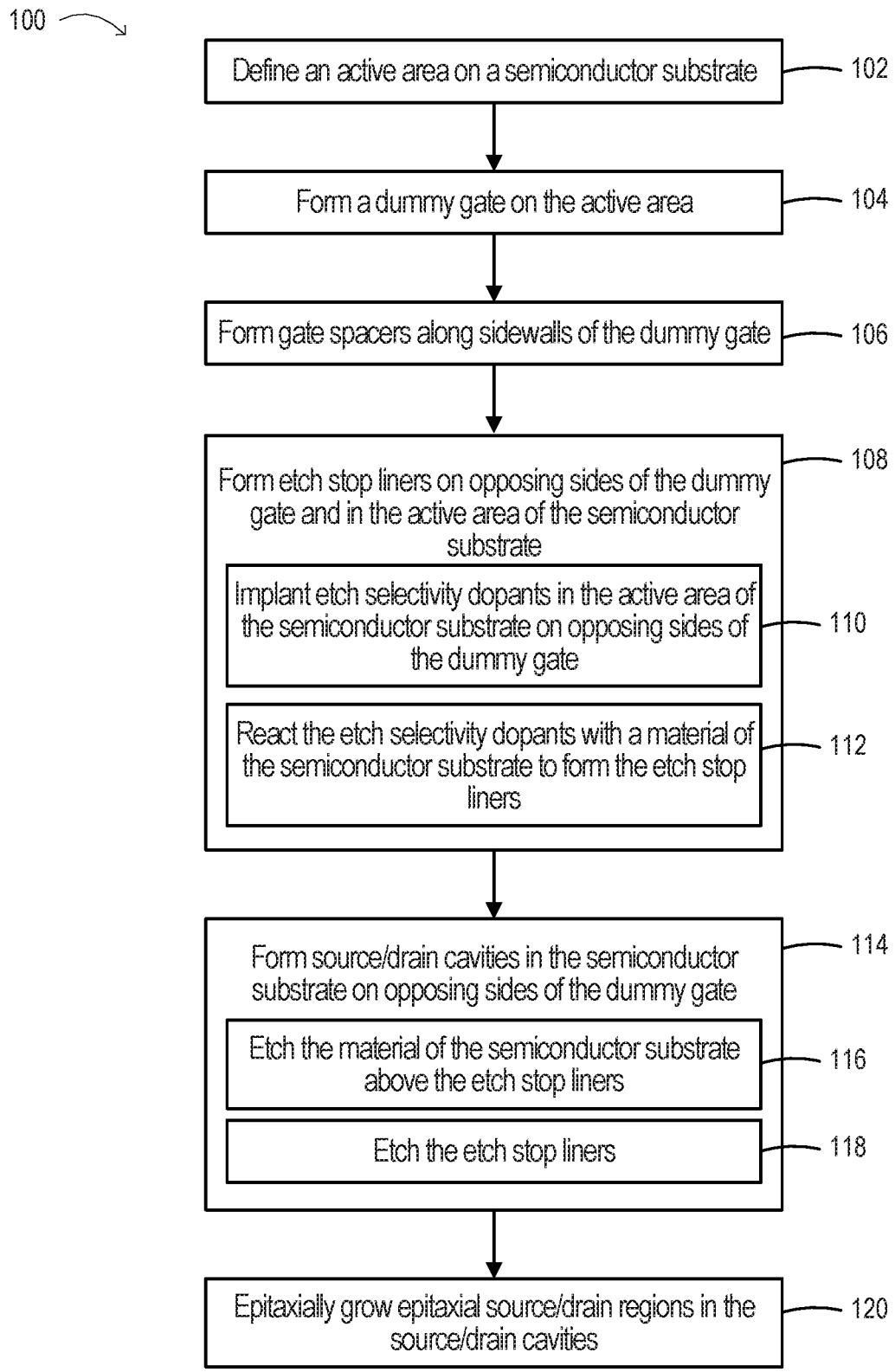
FIG. 8 is a flowchart of a method for semiconductor processing according to some examples.

FIG. 8 is a flowchart of a method for semiconductor processing according to some examples. At block 102, an active area is defined on a semiconductor substrate, such as described above with respect to FIG. 1. At block 104, a dummy gate is formed on the active area of the semiconductor substrate, such as described above with respect to FIG. 1. At block 106, gate spacers are formed along sidewalls of the dummy gate, such as described above with respect to FIG. 1.

At block 108, etch stop liners are formed on opposing sides of the dummy gate and in the active area of the semiconductor substrate. Block 108 includes, at block 110, implanting etch selectivity dopants (e.g., oxygen, nitrogen, or the like) in the active area of the semiconductor substrate on opposing sides of the dummy gate, such as described above with respect to FIG. 2. The implanting can include complementary tilt implants as described above. Block 108 then includes, at block 112, reacting the etch selectivity dopants with a material of the semiconductor substrate to form the etch stop liners, such as described above with respect to FIG. 3. The reacting at block 112 can include performing an anneal process.

At block 114, source/drain cavities are formed in the semiconductor substrate on opposing sides of the dummy gate. Block 114 includes, at block 116, etching the material of the semiconductor substrate above the etch stop liners, such as described above with respect to FIG. 4. Block 114 then includes, at block 118, etching the etch stop liners, such as described above with respect to FIG. 5.

At block 120, epitaxial source/drain regions are epitaxially grown in the source/drain cavities, such as described above with respect to FIG. 6. Further processing may be performed, such as described above with respect to FIG. 7.

Figure 9:
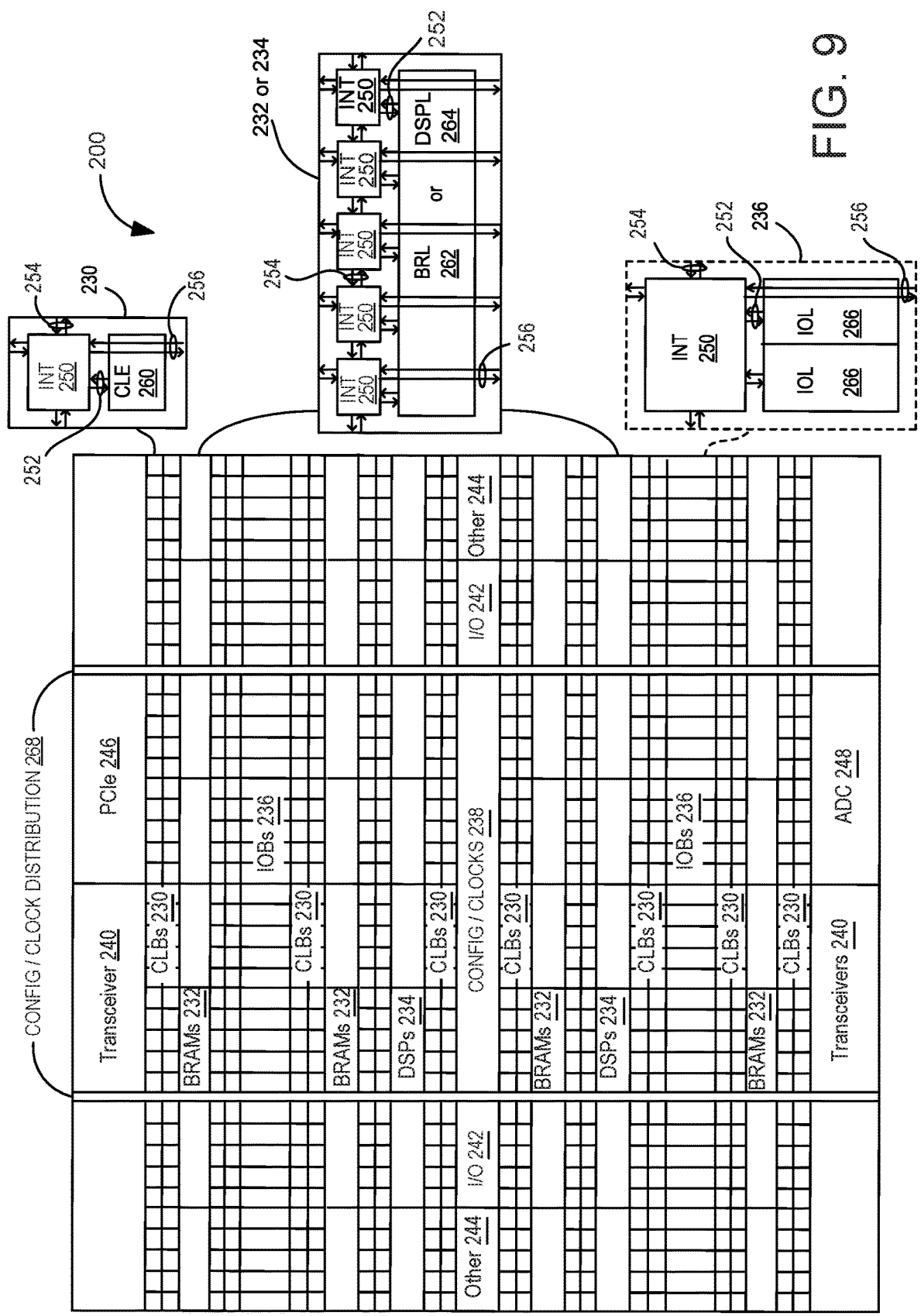
FIG. 9 depicts a field programmable gate array (FPGA) of a programmable integrated circuit (IC) that may implement transistors formed by semiconductor processing according to some examples.

FIG. 9 illustrates a field programmable gate array (FPGA) of a programmable integrated circuit (IC) 200 that may implement transistors formed by semiconductor processing methods described herein, according to some examples. The programmable IC 200 is implemented on a semiconductor substrate, such as typically included in a die or chip. The various circuits formed in the programmable IC 200 can include n-type FETs and p-type FETs in the semiconductor substrate, which FETs can be formed using semiconductor processing methods described herein.

The programmable IC 200 includes a large number of different programmable tiles including configurable logic blocks ("CLBs") 230, random access memory blocks ("BRAMs") 232, signal processing blocks ("DSPs") 234, input/output blocks ("IOBs") 236, configuration and clocking logic ("CONFIG/CLOCKS") 238, digital transceivers 240, specialized input/output blocks ("I/O") 242 (e.g., configuration ports and clock ports), and other programmable logic 244 such as digital clock managers, system monitoring logic, and so forth. The FPGA can also include PCIe interfaces 246, analog-to-digital converters (ADC) 248, and the like.

In some FPGAs, each programmable tile can include at least one programmable interconnect element ("INT") 250 having connections to input and output terminals 252 of a programmable logic element within the same tile, as shown by examples included in FIG. 9. Each programmable interconnect element 250 can also include connections to interconnect segments 254 of adjacent programmable interconnect element(s) in the same tile or other tile(s). Each programmable interconnect element 250 can also include connections to interconnect segments 256 of general routing resources between logic blocks (not shown). The general routing resources can include routing channels between logic blocks (not shown) comprising tracks of interconnect segments (e.g., interconnect segments 256) and switch blocks (not shown) for connecting interconnect segments. The interconnect segments of the general routing resources (e.g., interconnect segments 256) can span one or more logic blocks. The programmable interconnect elements 250 taken together with the general routing resources implement a programmable interconnect structure ("programmable interconnect") for the illustrated FPGA.

In an example implementation, a CLB 230 can include a configurable logic element ("CLE") 260 that can be programmed to implement user logic plus a single programmable interconnect element ("INT") 250. A BRAM 232 can include a BRAM logic element ("BRL") 262 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 234 can include a DSP logic element ("DSPL") 264 in addition to an appropriate number of programmable interconnect elements. An 10B 236 can include, for example, two instances of an input/output logic element ("IOL") 266 in addition to one instance of the programmable interconnect element 250. As will be clear to those of skill in the art, the actual I/O pads connected, for example, to the input/output logic element 266 typically are not confined to the area of the input/output logic element 266.

In the pictured example, a horizontal area near the center of the die is used for configuration, clock, and other control logic. Vertical columns 268 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA, more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method for semiconductor processing, the method comprising:
    forming an etch stop liner in a semiconductor substrate comprising implanting etch selectivity dopants into the semiconductor substrate, the etch selectivity dopants forming at least part of the etch stop liner;
    forming a source/drain cavity in the semiconductor substrate comprising etching the etch stop liner, wherein etching the etch stop liner selectively etches the etch stop liner relative to a material of the semiconductor substrate; and
    epitaxially growing a source/drain region in the source/drain cavity, wherein forming the source/drain cavity in the semiconductor substrate further comprises etching the material of the semiconductor substrate above the etch stop liner, wherein etching the material of the semiconductor substrate selectively etches the material of the semiconductor substrate relative to the etch stop liner.

2. The method of claim 1, wherein forming the etch stop liner further comprises performing an anneal after implanting the etch selectivity dopants, the etch selectivity dopants reacting with the material of the semiconductor substrate to form the etch stop liner.

3. The method of claim 1, wherein the etch selectivity dopants include oxygen, the material of the semiconductor substrate is silicon, and the etch stop liner is silicon oxide.

4. The method of claim 1, wherein a gate spacer is on the semiconductor substrate, the source/drain cavity extending directly under the gate spacer.

5. The method of claim 1, wherein implanting the etch selectivity dopants comprises performing a tilt implant.

6. The method of claim 1, wherein the source/drain cavity has a non-crystalline plane surface.

7. The method of claim 6, wherein the non-crystalline plane surface is curved.

8. A method for semiconductor processing, the method comprising:
    forming a gate structure on a semiconductor substrate;
    implanting etch selectivity dopants into the semiconductor substrate on opposing sides of the gate structure, the etch selectivity dopants forming at least part of respective etch stop liners in the semiconductor substrate on the opposing sides of the gate structure;

etching the etch stop liners to define surfaces of cavities in the semiconductor substrate on the opposing sides of the gate structure;

epitaxially growing a source/drain region in each of the cavities; and etching a material of the semiconductor substrate above the etch stop liners before etching the etch stop liners, wherein etching the material of the semiconductor substrate selectively etches the material of the semiconductor substrate relative to the etch stop liners, and etching the etch stop liners selectively etches the etch stop liners relative to the material of the semiconductor substrate.

9. The method of claim 8 further comprising reacting the etch selectivity dopants with a material of the semiconductor substrate, reacting comprising performing an anneal process.

10. The method of claim 8, wherein implanting the etch selectivity dopants includes performing complementary tilt implants.

11. The method of claim 8 further comprising forming gate spacers along respective sidewalls of the gate structure and on the semiconductor substrate, at least one surface of each of the cavities being at least partially directly under a respective one of the gate spacers.

12. The method of claim 11, wherein the at least one surface of each of the cavities is a non-crystalline plane surface.

13. The method of claim 12, wherein the non-crystalline plane surface is a curved surface.

14. A method for semiconductor processing, the method comprising:

forming a gate structure on a semiconductor substrate;

forming a gate spacer along a sidewall of the gate structure and on the semiconductor substrate;

implanting oxygen into the semiconductor substrate, the implanted oxygen extending to be at least partially directly under the gate spacer;

reacting the oxygen with a material of the semiconductor substrate to form an etch stop liner, reacting the oxygen with the material of the semiconductor substrate comprising performing an anneal;

etching the material of the semiconductor substrate above the etch stop liner, wherein etching the material of the semiconductor substrate selectively etches the material of the semiconductor substrate relative to the etch stop liner;

after etching the material of the semiconductor substrate, removing the etch stop liner comprising etching the etch stop liner, etching the etch stop liner selectively etches the etch stop liner relative to the material of the semiconductor substrate; and epitaxially growing an epitaxial material where the etch stop liner was removed; wherein implanting the oxygen comprises performing a tilt implant to implant the oxygen at least partially directly under the gate spacer.

15. The method of claim 14, wherein removal of the etch stop liner defines a surface of the material of the semiconductor substrate that is a non-crystalline plane surface that is at least partially directly under the gate spacer.

16. The method of claim 14, wherein the material of the semiconductor substrate is silicon, and the etch stop liner is silicon oxide.

17. The method of claim 15, wherein the non-crystalline plane surface is curved.

* * * * *